United States Patent
Wang et al.

(10) Patent No.: US 7,945,062 B2
(45) Date of Patent: May 17, 2011

(54) MICROELECTROMECHANICAL MICROPHONE PACKAGING SYSTEM

(75) Inventors: Wei-Chung Wang, Kaohsiung (TW);
Sung-Mao Wu, Kaohsiung (TW);
Hsueh-An Yang, Kaohsiung (TW);
Kuo-Pin Yang, Kaohsiung (TW);
Chian-Chi Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 1175 days.

(21) Appl. No.: 11/645,598

(22) Filed: Dec. 27, 2006

(65) Prior Publication Data

US 2007/0205499 A1    Sep. 6, 2007

(30) Foreign Application Priority Data

Mar. 3, 2006   (TW) ............................... 95107238 A

(51) Int. Cl.
*H04R 25/00* (2006.01)
*H04R 9/08* (2006.01)
*H04R 11/04* (2006.01)
*H04R 17/02* (2006.01)
*H04R 19/04* (2006.01)
*H04R 21/02* (2006.01)
*H01L 23/02* (2006.01)
*H01L 23/28* (2006.01)

(52) U.S. Cl. ........ 381/189; 381/175; 381/355; 381/369; 257/678; 257/787

(58) Field of Classification Search ................... 381/175, 381/189, 355, 369; 257/678, 787
See application file for complete search history.

(56) References Cited

U.S. PATENT DOCUMENTS

| 6,518,660 | B2* | 2/2003 | Kwon et al. | 257/704 |
| 6,534,848 | B1* | 3/2003 | Dornbos et al. | 257/678 |
| 7,009,302 | B2  | 3/2006 | Tao | |
| 7,166,910 | B2* | 1/2007 | Minervini | 257/704 |
| 7,352,876 | B2* | 4/2008 | Boor et al. | 381/174 |
| 2003/0133588 | A1 | 7/2003 | Pedersen | |

FOREIGN PATENT DOCUMENTS

| JP | 200216999 | 1/2002 |
| JP | 2002176696 | 6/2002 |
| TW | I235010 | 6/2005 |
| TW | I223422 | 2/2008 |

* cited by examiner

*Primary Examiner* — Lana N Le
*Assistant Examiner* — Matthew Eason
(74) *Attorney, Agent, or Firm* — Volentine & Whitt, P.L.L.C.

(57) ABSTRACT

The invention relates to a microelectromechanical microphone packaging system. The microelectromechanical microphone packaging system comprises a substrate, a chip, a microelectromechanical microphone, a conductive glue, a non-conductive glue and a cover. The substrate has a first surface. The chip is mounted on the first surface of the substrate. The microelectromechanical microphone is mounted on the first surface of the substrate, and electrically connected to the chip. The chip is enclosed by the non-conductive glue. The non-conductive glue is enclosed by the conductive glue. The cover is mounted on the first surface of the substrate to form a containing space, and has an acoustic aperture. The microelectromechanical microphone packaging system utilizes the conductive glue enclosing the chip and the non-conductive glue to shield interference from outside noise and obtain a shielding effect. In addition, the cover does not need to be made of metal material.

7 Claims, 2 Drawing Sheets

MICROELECTROMECHANICAL MICROPHONE PACKAGING SYSTEM

BACKGROUND OF THE INVENTION

1. Field of the Invention

The invention relates to a microelectromechanical microphone system, particularly to a microelectromechanical microphone packaging system.

2. Description of the Related Art

FIG. 1 shows a conventional microelectromechanical microphone packaging system. The conventional microelectromechanical microphone packaging system 10 comprises a substrate 11, a chip 12, a microelectromechanical microphone 13 and a metal cover 14. The substrate 11 has a first surface 111. The chip 12 is mounted on the first surface 111 of the substrate 11. The microelectromechanical microphone 13 is mounted on the first surface 111 of the substrate 11. The microelectromechanical microphone 13 is mounted by the side of the chip 12 and electrically connected to the chip 12.

The metal cover 14 covers the first surface 111 of the substrate 11 to form a containing space so as to protect the chip 12 and the microelectromechanical microphone 13. The metal cover 14 further comprises an acoustic aperture 141, so that the sound can be transmitted to the microelectromechanical microphone 13 through the acoustic aperture 141. In addition, by utilizing the metal cover 14 covering the chip 12 and the microelectromechanical microphone 13, interference of from outside noise can be shielded.

SUMMARY OF THE INVENTION

One objective of the present invention is to provide a microelectromechanical microphone packaging system. The microelectromechanical microphone packaging system comprises a substrate, a chip, a microelectromechanical microphone, a non-conductive glue, a conductive glue and a cover. The substrate has a first surface. The chip is mounted on the first surface of the substrate. The microelectromechanical microphone is mounted on the first surface of the substrate, and electrically connected to the chip. The chip is enclosed by the non-conductive glue. The non-conductive glue is enclosed by the conductive glue. The cover is mounted on the first surface of the substrate to form a containing space, and has an acoustic aperture.

The microelectromechanical microphone packaging system utilizes the conductive glue enclosing the chip and the non-conductive glue to shield interference from outside noise and obtain a shielding effect. In addition, the cover does not need to be made of metal material.

DETAILED DESCRIPTION OF THE INVENTION

Figure 1:
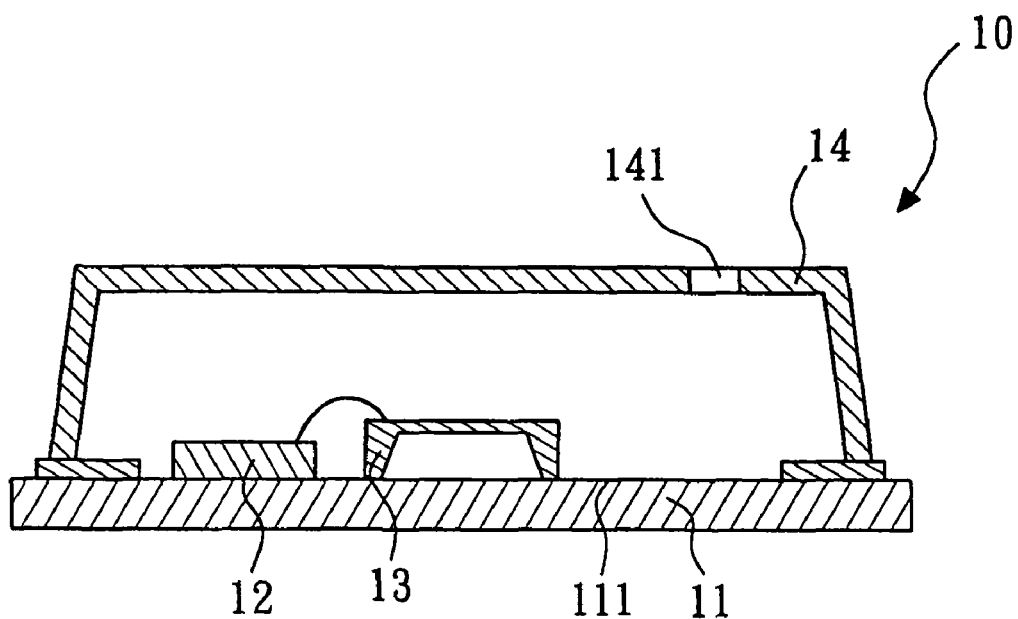
FIG. 1 shows a conventional microelectromechanical microphone packaging system.
Figure 2:
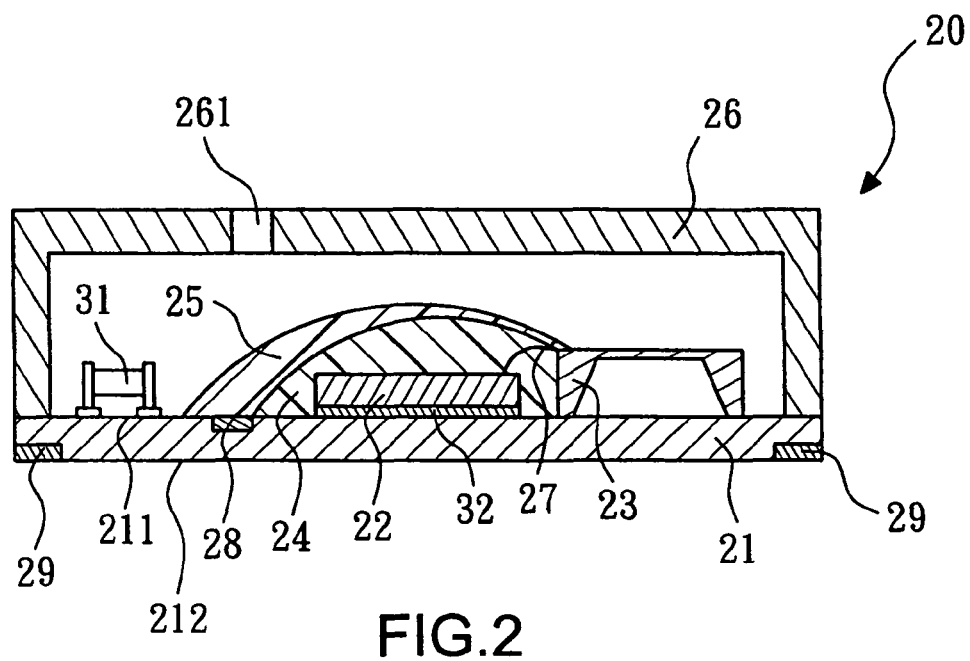
FIG. 2 shows a microelectromechanical microphone packaging system according to a first embodiment of the present invention.

FIG. 2 shows a microelectromechanical microphone packaging system 20 according to a first embodiment of the present invention. The microelectromechanical microphone packaging system 20 comprises a substrate 21, a chip 22, a microelectromechanical microphone 23, a non-conductive glue 24, a conductive glue 25 and a cover 26. The substrate 21 has a first surface 211 and a second surface 212. The second surface 212 is opposite to the first surface 211. The chip 22 is mounted on the first surface 211 of the substrate 21. In the embodiment, the chip 22 is mounted on the first surface 211 of the substrate 21 by an adhesive glue 32.

The microelectromechanical microphone 23 is mounted on the first surface 211 of the substrate 21 and electrically connected to the chip 22. In the embodiment, the chip 22 and the microelectromechanical microphone 23 are electrically connected by a plurality of wires 27. The microelectromechanical microphone 23 may be produced by etching a silicon.

The non-conductive glue 24 encloses the chip 22 and the wires 27. In the embodiment, the non-conductive glue 24 further encloses part of the edge of the microelectromechanical microphone 23. The conductive glue 25 encloses the non-conductive glue 24. In the embodiment, the conductive glue 25 further encloses part of the edge of the microelectromechanical microphone 23. The conductive glue 25 is a silver glue. The conductive glue 25 encloses the chip 22 and the non-conductive glue 24 so as to obtain a shielding effect, so that interference from outside noise that influences the operation of the chip 22 can be isolated.

The microelectromechanical microphone packaging system 20 further comprises a grounding pad 28. The grounding pad 28 is disposed on the first surface 211 of the substrate 21 and electrically connected to the conductive glue 25. The grounding pad 28 may be electrically connected to an outside grounding terminal so that the conductive glue 25 acts as a grounding terminal so as to obtain a better shielding effect.

The cover 26 is mounted on the first surface 211 of the substrate 21 to form a containing space. The chip 22, the microelectromechanical microphone 23, the non-conductive glue 24, and the conductive glue 25 are accommodated in the containing space and therefore protected by the cover 26. The cover 26 has an acoustic aperture 261. The sound can be transmitted to the microelectromechanical microphone 23 through the acoustic aperture 261. In the embodiment, the cover 26 is one-piece and approximately inverse u-shaped. Since the conductive glue 25 can provide shielding effect, the cover 26 need not be made of metal material and can be made from other materials, so that the production cost can be reduced.

The microelectromechanical microphone packaging system 20 further comprises a plurality of contacts 29. The contacts 29 are disposed on the second surface 212 of the substrate 21. The contacts 29 are used to electrically connect with outside elements. The microelectromechanical microphone packaging system 20 further comprises a passive element 31. The passive element 31 is disposed on the first surface 211 of the substrate 21.

Figure 3:
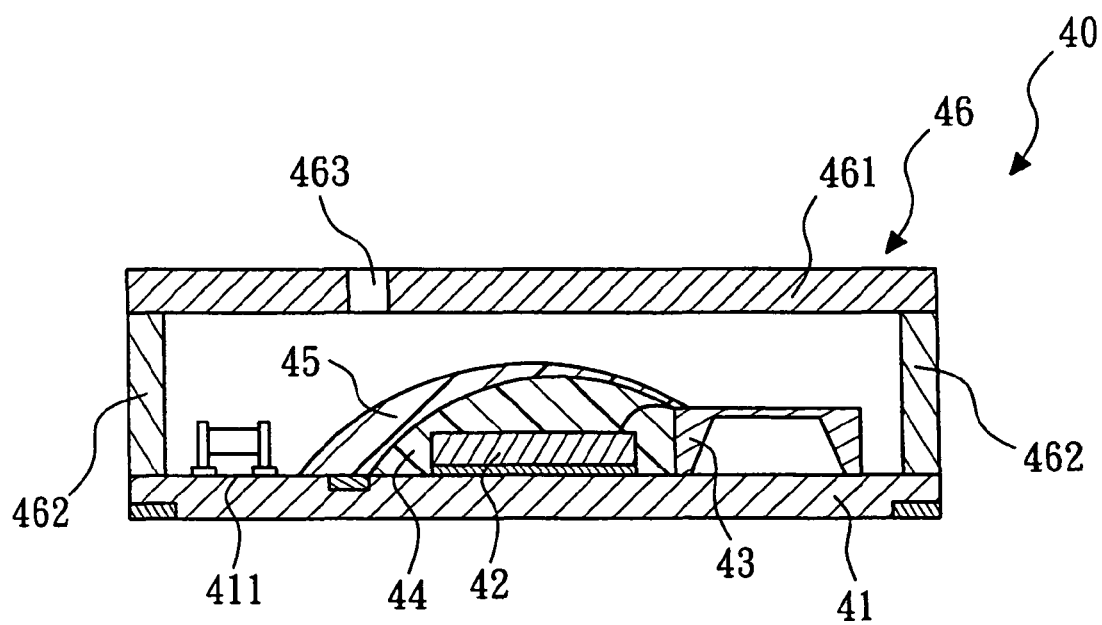
FIG. 3 shows a microelectromechanical microphone packaging system according to a second embodiment of the present invention.

FIG. 3 shows a microelectromechanical microphone packaging system 40 according to a second embodiment of the present invention. The microelectromechanical microphone packaging system 40 comprises a substrate 41, a chip 42, a microelectromechanical microphone 43, a non-conductive glue 44, a conductive glue 45 and a cover 46. The difference between the microelectromechanical microphone packaging system 40 of the second embodiment and the microelectromechanical microphone packaging system 20 of the first embodiment is that the cover 46 of the microelectromechanical microphone packaging system 40 is not one-piece. The cover 46 comprises a covering plate 461 and at least one supporting portion 462. The supporting portion 462 is formed around the edge of the first surface 411 of the substrate 41. The covering plate 461 is disposed on the supporting portion 462, so that the shape of the cover 46 can be flexibly designed.

Furthermore, the conductive glue 45 can provide a shielding effect, so that the cover 46 need not be made of metal material and can be made from other materials, and the production cost can be reduced. In addition, an acoustic aperture 463 is formed at the covering plate 461.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A microelectromechanical microphone packaging system comprising:
    a substrate, having a first surface;
    a chip, mounted on the first surface of the substrate;
    a microelectromechanical microphone, mounted on the first surface of the substrate and electrically connected to the chip;
    a non-conductive glue, enclosing the chip;
    a conductive glue, enclosing the non-conductive glue; and
    a cover, mounted on the first surface of the substrate to form a containing space and having an acoustic aperture.

2. The microelectromechanical microphone packaging system according to claim 1, further comprising a grounding pad, disposed on the first surface of the substrate and electrically connected to the conductive glue.

3. The microelectromechanical microphone packaging system according to claim 1, wherein the cover comprises a covering plate and at least one supporting portion, the supporting portion is formed around the edge of the first surface of the substrate, the covering plate is disposed on the supporting portion, and the acoustic aperture is formed at the covering plate.

4. The microelectromechanical microphone packaging system according to claim 1, further comprising a plurality of contacts disposed on a second surface of the substrate, wherein the second surface is opposite to the first surface.

5. The microelectromechanical microphone packaging system according to claim 1, further comprising a plurality of wires for electrically connecting the chip and the microelectromechanical microphone.

6. The microelectromechanical microphone packaging system according to claim 1, further comprising a passive element disposed on the first surface of the substrate.

7. The microelectromechanical microphone packaging system according to claim 1, wherein the conductive glue is a silver glue.

* * * * *